(12) United States Patent
Rotondaro

(10) Patent No.: US 8,384,138 B2
(45) Date of Patent: Feb. 26, 2013

(54) DEFECT PREVENTION ON SRAM CELLS THAT INCORPORATE SELECTIVE EPITAXIAL REGIONS

(75) Inventor: Antonio Luis Pacheco Rotondaro, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/453,190

(22) Filed: Jun. 14, 2006

(65) Prior Publication Data

US 2007/0290192 A1 Dec. 20, 2007

(51) Int. Cl.
*H01L 29/94* (2006.01)

(52) U.S. Cl. .................... 257/296; 257/E29.17; 438/155

(58) Field of Classification Search .......... 257/903–904, 257/E29.17, E21.645–E21.694, E27.98, E21.661, 257/296, 316, 390, 369, 19; 438/155, 275
See application file for complete search history.

(56) References Cited

U.S. PATENT DOCUMENTS

| | | | |
|---|---|---|---|
| 5,148,255 A * | 9/1992 | Nakazato et al. | 257/378 |
| 5,939,740 A * | 8/1999 | Hashimoto et al. | 257/213 |
| 6,753,219 B2 * | 6/2004 | Sekiguchi et al. | 438/253 |
| 7,405,131 B2 * | 7/2008 | Chong et al. | 438/300 |
| 2002/0137295 A1 * | 9/2002 | Thei et al. | 438/296 |
| 2003/0173625 A1 * | 9/2003 | Choi | 257/369 |
| 2005/0180199 A1 * | 8/2005 | Liaw | 365/154 |
| 2006/0014354 A1 * | 1/2006 | Chen et al. | 438/369 |
| 2006/0246709 A1 * | 11/2006 | Kim et al. | 438/618 |
| 2007/0045709 A1 * | 3/2007 | Yang | 257/315 |
| 2007/0128786 A1 * | 6/2007 | Cheng et al. | 438/199 |

* cited by examiner

Primary Examiner — Tony Tran
(74) Attorney, Agent, or Firm — Alan A. R. Cooper; Wade J. Brady, III; Frederick J. Telecky, Jr.

(57) ABSTRACT

An SRAM device and method of forming MOS transistors of the device having reduced defects associated with selective epitaxial growth in moat tip regions is discussed. The SRAM device comprises a core region and a logic region, logic transistors within the logic region of the SRAM, and selective epitaxial regions grown on both source and drain regions; and memory cell transistors within the core region of the SRAM, and having the selective epitaxial regions grown on only one of the source and drain regions. One method of forming the MOS transistors of the SRAM cell comprises forming a gate structure over a first conductivity type substrate to define a channel therein, masking one of the source and drain regions in the core region, forming a recess in the substrate of the unmasked side of the channel, epitaxially growing SiGe in the recess, removing the mask, and forming the source and drain extension regions in source/drain regions.

7 Claims, 14 Drawing Sheets

DEFECT PREVENTION ON SRAM CELLS THAT INCORPORATE SELECTIVE EPITAXIAL REGIONS

FIELD OF INVENTION

The present invention relates generally to semiconductor devices and more particularly to static random access memory (SRAM) devices and associated methods of manufacture having reduced defects associated with selective epitaxial growth in moat tip regions, and improved low leakage transistors having improved mobility due to channel strain.

BACKGROUND OF THE INVENTION

A conventional MOS transistor generally includes a semiconductor substrate, such as silicon, having a source, a drain, and a channel positioned between the source and drain. A gate stack composed of a conductive material (a gate conductor), an oxide layer (a gate oxide), and sidewall spacers, is typically located above the channel. The gate oxide is typically located directly above the channel, while the gate conductor, generally comprised of polycrystalline silicon (poly or polysilicon) material, is located above the gate oxide. The sidewall spacers protect the sidewalls of the gate conductor and localize the source and drain dopants relative to the gate conductor.

Generally, for a given electric field across the channel of a MOS transistor, the amount of current that flows through the channel is directly proportional to a mobility of carriers in the channel. Thus the higher the mobility of the carriers in the channel, the more current can flow and the faster a circuit can perform when using high mobility MOS transistors. One way to increase the mobility of the carriers in the channel of an MOS transistor is to produce a mechanical stress in the channel.

A compressive strained channel has significant hole mobility enhancement over conventional devices. A tensile strained channel achieves significant electron mobility enhancement. The most common method of introducing strain in a silicon channel region is to recess the source and drain regions adjacent to the channel and to fill the recessed regions with a stressor material by selective epitaxial growth.

A compressive strain in the channel is obtained when the stressor material epitaxially grown is SiGe. Similarly, tensile strain in the channel is obtained when the stressor material is Si:C.

SRAM devices, for example, use a mixture of such MOS transistors on an integrated circuit chip including carefully tailored and matched transistors utilized in the memory array (core region) as well as general purpose logic transistors used in various peripheral control circuits (logic region) which control access to the array. However, advanced SRAM devices have a tendency to produce various defects associated with selective epitaxial growth in moat tip regions. These defects are due to the reduced dimensions of the region, preventing proper epitaxial growth and resulting in extremely thin epitaxial layers. Such defects also result in degraded electrical characteristics, degraded contacts and silicide formation, and poor diode characteristics. In addition, transistors fabricated with selective epitaxial regions in the source/drains suffer from high off-state current due to subsurface leakage.

It would be advantageous to have an SRAM device and method that effectively and reliably provides strain to the device in order to improve carrier mobility, while reducing defects associated with selective epitaxial growth in moat tip regions of the core region.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to a device and method of fabrication wherein the MOS transistors, for example, generally PMOS transistors of an SRAM memory device having core and logic regions, exhibit improved mobility or drive current due to the application of stress to the channel, and reduced defects associated with selective epitaxial growth in moat tip regions of the core region. The MOS transistors have a stress application region formed in the semiconductor body near the channel region; consequently, less stress inducing species is needed to obtain the desired strain within the channel, thereby providing improved carrier mobility without a substantial number of threading dislocation defects. In the fabrication of the SRAM device, the moat tip regions of these PMOS transistors are protected from etching and selective epitaxial growth in the moat tip regions that otherwise may cause thinning of the epitaxial growth in the source or drain regions neighboring the shallow trench isolation (STI) areas.

In particular, PMOS transistors of the SRAM memory cells that have source and drain regions adjacent to STI regions (generally corresponding to moat tip regions) are masked with an epitaxial etch mask to avoid the etching and selective epitaxial growth in these regions neighboring the STI structures. The stress inducing regions in the semiconductor body are formed by selective epitaxial deposition of a silicon germanium material within recesses formed in the body. The recesses are formed in the body self-aligned to the edges of offset spacers and prior to the formation of the sidewall spacers employed for source/drain implants. Consequently, the recesses are very close to the channel and strain associated with the silicon germanium material therein is more effectively translated to the channel.

In accordance with one aspect of the present invention, an asymmetric SRAM memory device having MOS transistors in logic and core regions, comprises one or more logic transistors having a semiconductor body of a first conductivity type, and selective epitaxial region grown on both source and drain regions of the logic transistor. The SRAM device further comprises one or more memory cell transistors within the core region having a semiconductor body of the first conductivity type, and having selective epitaxial regions grown on only one of the source and drain regions of the cell transistors, the other one of the source and drain regions generally corresponding to moat tip regions.

In accordance with another aspect of the present invention, a method of asymmetrically forming a MOS transistor is provided, wherein a gate structure is formed over a semiconductor body, thereby defining a channel region therebelow. A mask (e.g., an epitaxial etch mask used prior to etch processing and selective epitaxial growth) is patterned over one of a source and drain regions on opposing sides of the channel of the MOS transistor, for example, in one embodiment of the invention, the masked region generally corresponding to a moat tip region. A recess is formed in the body that is self-aligned with respect to the gate structure in the other unmasked one of the source and drain regions corresponding to the unmasked side of the channel. In one example, the recess is formed immediately after mask patterning or after formation of offset spacers (used for extension region implants) on lateral edges of the gate. The recess is then filled with silicon germanium via a selective epitaxial deposition process. The silicon germanium material has different lattice spacing than the silicon channel, thereby imparting a compressive strain to the channel region under the gate. The mask is removed and the source and drain extension regions are formed of a second conductivity type in the semiconductor body in the source and drain regions. Thereafter, conventional back-end processes may be utilized.

Similarly, in another aspect of the present invention, a method of asymmetrically forming MOS transistors of an SRAM memory device having a logic and core region comprises forming a gate structure over a first type semiconductor body of the MOS transistors in both logic and core regions of the SRAM device. A mask (e.g., an epitaxial etch mask, used prior to etch processing and selective epitaxial growth) is patterned over both source and drain regions on opposing sides of the channel of the MOS transistors in the logic region. A mask is patterned over one of the source and drain regions on opposing sides of the channel of the MOS transistors in the core region, the masked region generally corresponding to a moat tip region. Recesses are formed in the body that are self-aligned with respect to the gate structure in the unmasked source and drain regions. In one example, the recess is formed immediately after mask patterning or after formation of offset spacers (used for extension region implants) on lateral edges of the gate. The recess is then filled with silicon germanium via a selective epitaxial deposition process. The mask is removed and the source and drain extension regions are formed of a second conductivity type in the semiconductor body in the source and drain regions. Thereafter, conventional back-end processes may be utilized.

In one aspect of the invention, the first conductivity type semiconductor body of the MOS transistor comprises PMOS transistors of a 6T SRAM cell.

In one example, the silicon germanium material is doped with boron in-situ for the formation of p-type extension regions. In another example, an extension region implant is performed into the silicon germanium material after the selective epitaxial deposition, followed by the formation of sidewall spacers and source/drain implants.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
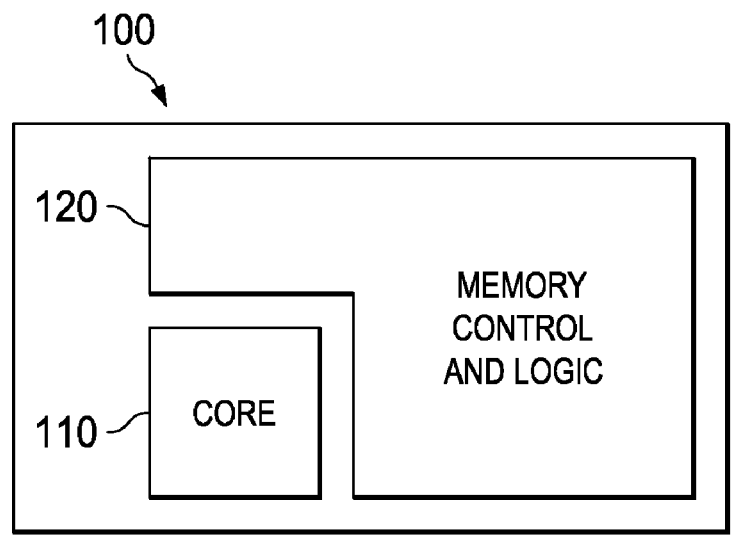
FIG. 1 is a block diagram of an exemplary semiconductor device that incorporates SRAM memory circuitry such as may be used in accordance with one or more aspects of the present invention, the device having core and logic regions.

One or more implementations of the present invention will now be described with reference to the attached drawings, wherein like reference numerals are used to refer to like elements throughout, and wherein the illustrated structures are not necessarily drawn to scale. The invention provides transistor and SRAM memory structures and methods in which transistor mobility or drive current is improved while minimizing defects associated with selective epitaxial growth in moat tip regions of the core region of such memory devices.

Referring now to FIG. 1, an exemplary semiconductor device that incorporates SRAM memory circuitry 100 is illustrated such as may be used in accordance with one or more aspects of the present invention. The SRAM memory containing device 100 comprises, for example, a semiconductor integrated circuit chip having a core region 110 and a logic region 120. The core region 110 comprises an array of SRAM memory cells, for example, an array of 6T SRAM memory cells such as SRAM cell 200 of FIGS. 2A-2E. The logic region 120 comprises various memory control and logic functions associated with accessing, reading, and writing operations of the memory array 110 as well as general logic for the device.

Figure 2A:
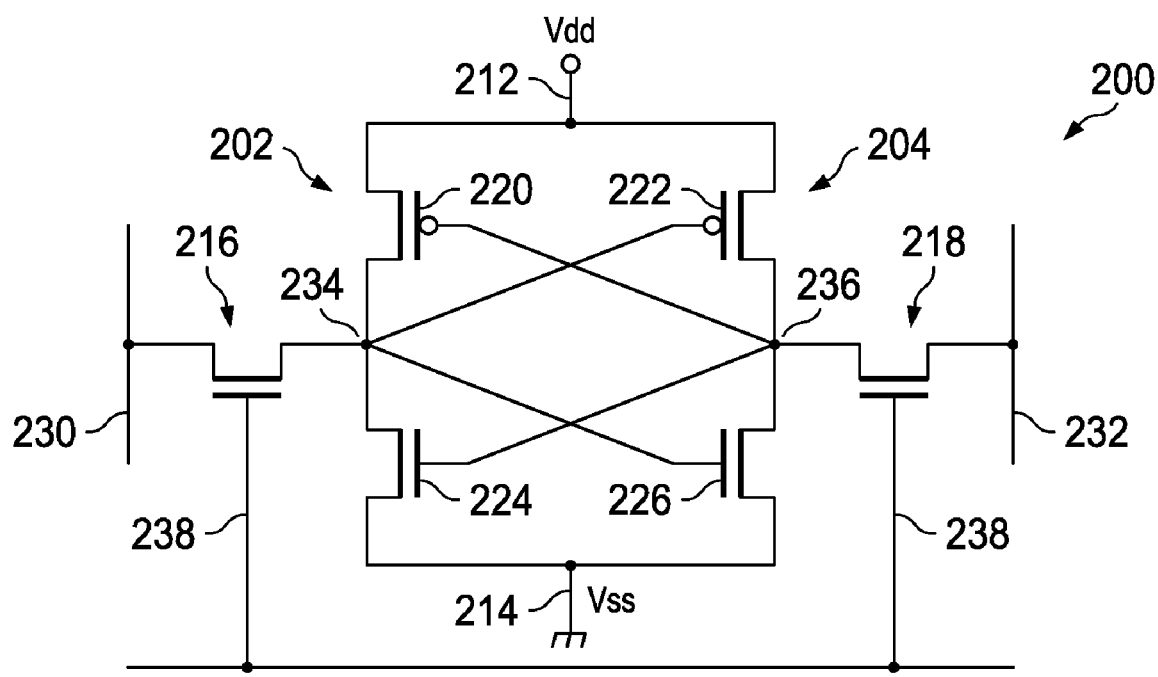
FIG. 2A is a schematic diagram of a conventional 6T static random access memory (SRAM) cell.

FIG. 2A illustrates a schematic diagram of an exemplary 6T static random access memory (SRAM) cell 200 such as may be used in accordance with the system and methods of the present invention.

Figure 2B:
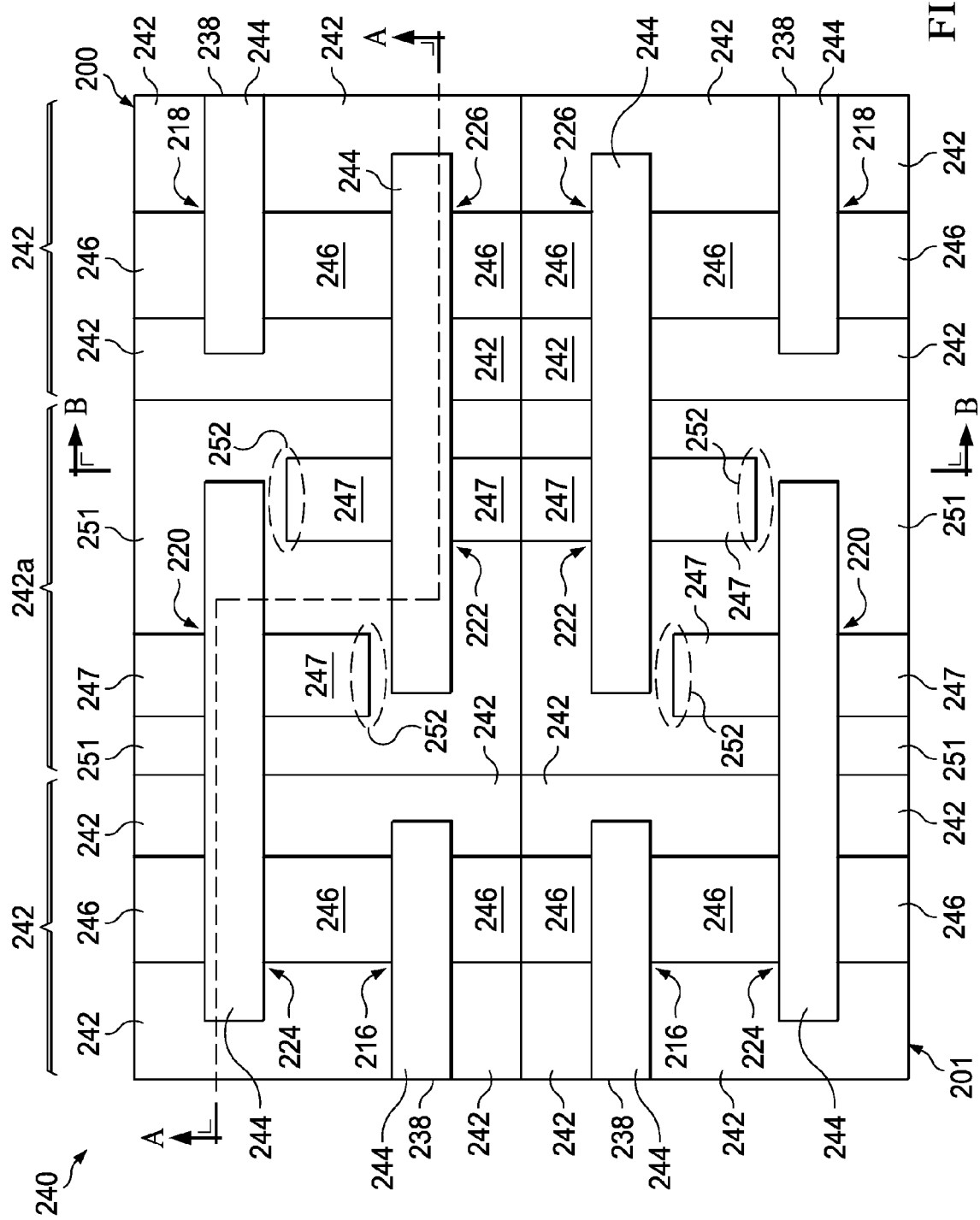
FIGS. 2B-2E are top plan and corresponding cross-sectional side views illustrating a conventional epitaxial etch mask pattern that determines which regions will be etched in a substrate of the SRAM cell of FIG. 2A, and including some typical defects that may result during subsequent selective epitaxial growth thereon in such regions.
Figure 2C:
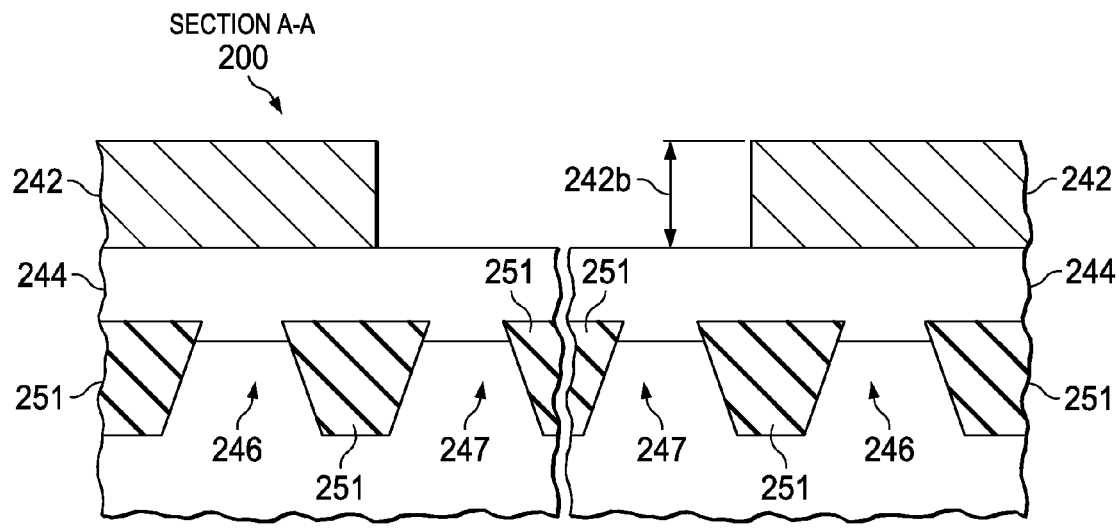
Figure 2D:
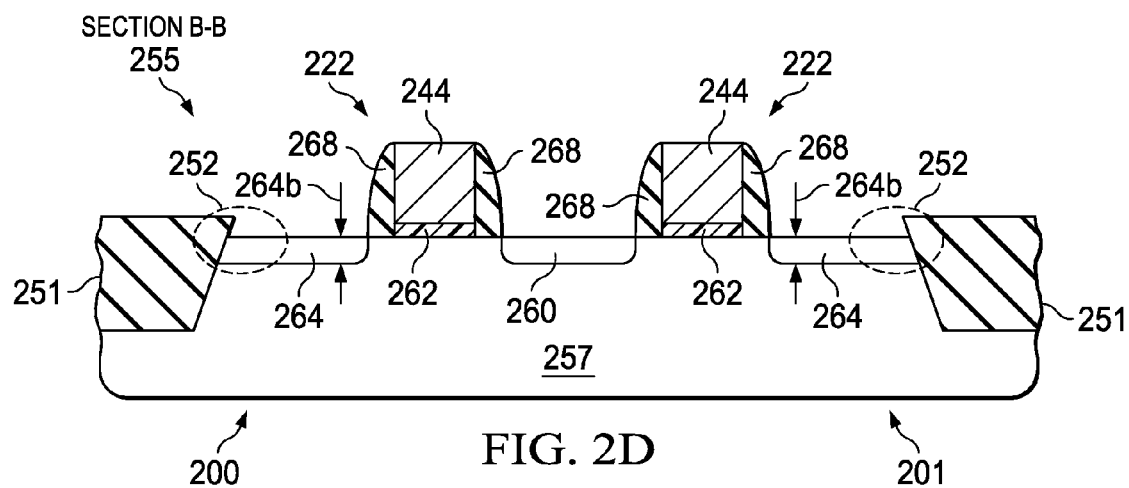
Figure 2E:
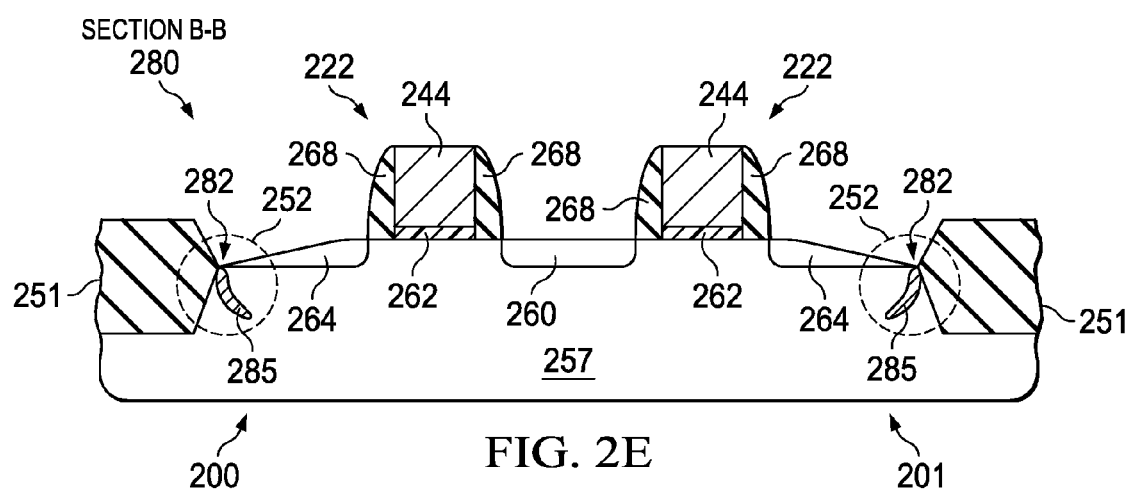

FIGS. 2B, 2C, 2D, and 2E are top plan and corresponding cross-sectional side views, respectively, illustrating conventional epitaxial etch mask patterns that determine which regions will be etched in a substrate of the 6T SRAM cell 200 of FIG. 2A. FIG. 2E further illustrates some typical defects that may result during subsequent selective epitaxial (epi) growth in such regions. FIG. 2C is a composite broken cross-sectional view taken along the line A-A in FIG. 2B. FIGS. 2D and 2E are cross-sectional views taken along the line B-B in FIG. 2B.

FIG. 2A, for example, illustrates a typical SRAM cell 200, which generally comprises a pair of cross-coupled inverters 202, 204, generally connected between Vdd 212 and Vss 214 to store a data bit state. SRAM cell 200 further comprises a pair of pass transistors including pass gate A 216 and pass gate B 218 to read and write a data bit between the cross-coupled inverters, inverter A 202 and inverter B 204, and bitline BL 230 and bitline-bar BLB 232, respectively. Respective inverters 202, 204 comprise p-type MOS (PMOS) pull-up or load transistors; load transistor A 220 and load transistor B 222, and an n-type (NMOS) pull-down or driver transistor A 224 and driver transistor B 226. Pass gate transistors 216, 218 are generally n-type as well, generally having shared gate leads connected together, and controlled by the same wordline WL 238.

The illustrated exemplary SRAM cell comprises six transistors and is termed a 6T full CMOS SRAM cell. When the channels of all the transistors are formed in the single crystal silicon substrate, it is called a single crystalline bulk CMOS 6T SRAM cell. It is also referred to as a planar SRAM cell when all the transistors are made in the same substrate material (e.g., bulk crystalline silicon, SOI, etc.).

FIGS. 2B and 2C, for example, illustrate a layout of an SRAM array 240 of two such SRAM memory cells 200 and 201, during an epitaxial (epi) etch mask 242 patterning step of a fabrication process. SRAM cells 200 and 201 of array 240 are arranged adjacent to each other having horizontal rows of polysilicon gate structures 244 and sharing vertical columns of NMOS active regions 246 and PMOS active regions 247, and having isolation structures, for example, shallow trench isolation regions (STI) 251 therebetween to separate NMOS transistors formed in the active regions 246 from the PMOS transistors formed in the active regions 247. In the illustrated fabrication step, the epitaxial etch mask 242 is patterned overlying the NMOS active regions 246, thereby forming unmasked openings 242a in the mask 242 having a thickness 242b that exposes the PMOS active regions 247 to a subsequent etch process and to a selective epitaxial growth in these unmasked openings 242a.

In general, SRAM cells are more stable and have better data retention when the respective PMOS (220, 222) transistors and NMOS (224, 226) transistors are matched for the two inverters (202, 204). However, as dimensions are continually reduced to scale down devices, advanced SRAM devices have a tendency to produce defects associated with the selective epitaxial growth in moat tip regions 252.

For example, FIGS. 2D and 2E illustrate a cross section taken along the line B-B in FIG. 2B of two PMOS load B transistors 222 of the two adjacent cells 200 and 201 sharing a single n-well 257 and a common source/drain region 260. In particular, the shared source/drain region 260 is the drain connection to the Vdd 212 drain terminal. The other outside source/drain regions 264 adjacent to the STI structures STI 251, are ideally etched and grown in the selective epitaxial etch and growth processes to provide a uniform full thickness 264b of FIG. 2D. It will be appreciated that FIGS. 2D and 2E may also represent two PMOS load A transistors 220. FIGS. 2D and 2E further illustrate details of a gate structure of load transistor load B 222, comprising a gate oxide layer 262 formed overlying the n-doped silicon of the n-well 257, a gate polysilicon structure 244 overlying the gate oxide 262, and side wall spacers 268 formed on lateral sidewalls of the gate for self-aligning subsequent source/drain implant processes in the source/drain regions 260 and 264.

However, because of the continued scaling of dimension in these advanced SRAM devices, such proper epitaxial growth is often inhibited in these moat tip regions 252 and results in extremely thin epitaxial growth defect area 282 in the source/drain regions 264 adjacent to isolation structures STI 251. As shown by defect area 282 in FIG. 2E, the SiGe growth is slowed or inhibited by the proximity to the isolation structure STI 251, thus the SiGe growth in the source/drain region 264 assumes a tapered shape which gradually regains nearly full depth 264b further from the STI 251.

Such defects also result in degraded electrical characteristics of the transistors of the SRAM cells 200, 201, degraded contacts and silicide formation, and poor diode characteristics. Another defect that may be produced in the moat tip regions 252, occurs because of an increased propensity for silicide pipe formation 285. The silicide pipe 285 may comprise a nickel silicide formed during a silicidation process just below a triple point created by the thinned source/drain region 264, the STI 251, and the n-well 257. The silicide pipe 285 tends to detrimentally short these regions to the transistor channel and to the substrate. In addition, transistors fabricated with selective epitaxial regions grown at both source/drains 260 and 264 suffer from high off-state current due to subsurface leakage (e.g., in the n-well 257) because these subsurface regions are further from the control of the gate.

Accordingly, the solution of the present invention, is to protect or mask the moat tip regions during the entire epitaxial loop, which comprises an etch process for recess formation and the selective epitaxial growth within the recesses. Thus, those areas which are masked will not receive the recess etch or the epitaxial growth of, for example, silicon germanium (SiGe), boron doped SiGe, or carbon doped silicon.

Figure 3A:
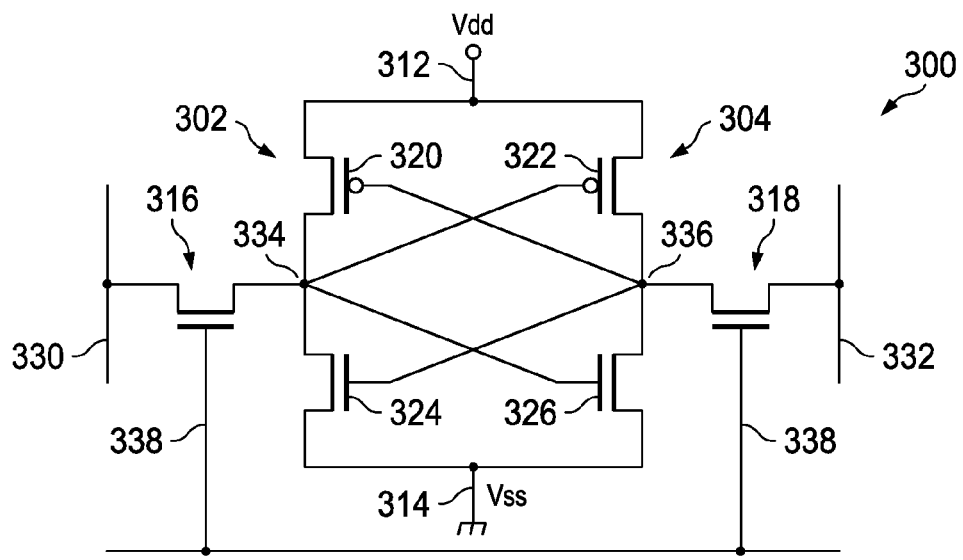
FIG. 3A is a schematic diagram of another 6T static random access memory (SRAM) cell such as may be used in accordance with the present invention.
Figure 3C:
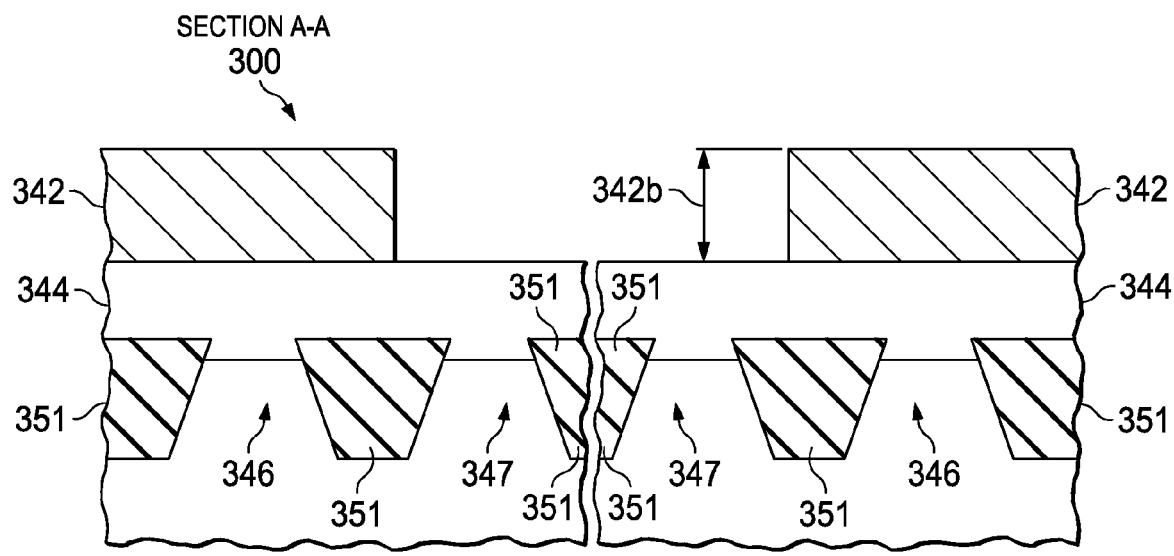
FIGS. 3B and 3C are a top plan and a corresponding cross-sectional side view illustrating an exemplary modified epitaxial etch mask pattern used in accordance with the present invention that prevents etching and subsequent selective epitaxial growth from the source/drain regions that generally correspond to moat tip regions of the SRAM cell of FIG. 3A.
Figure 3B:
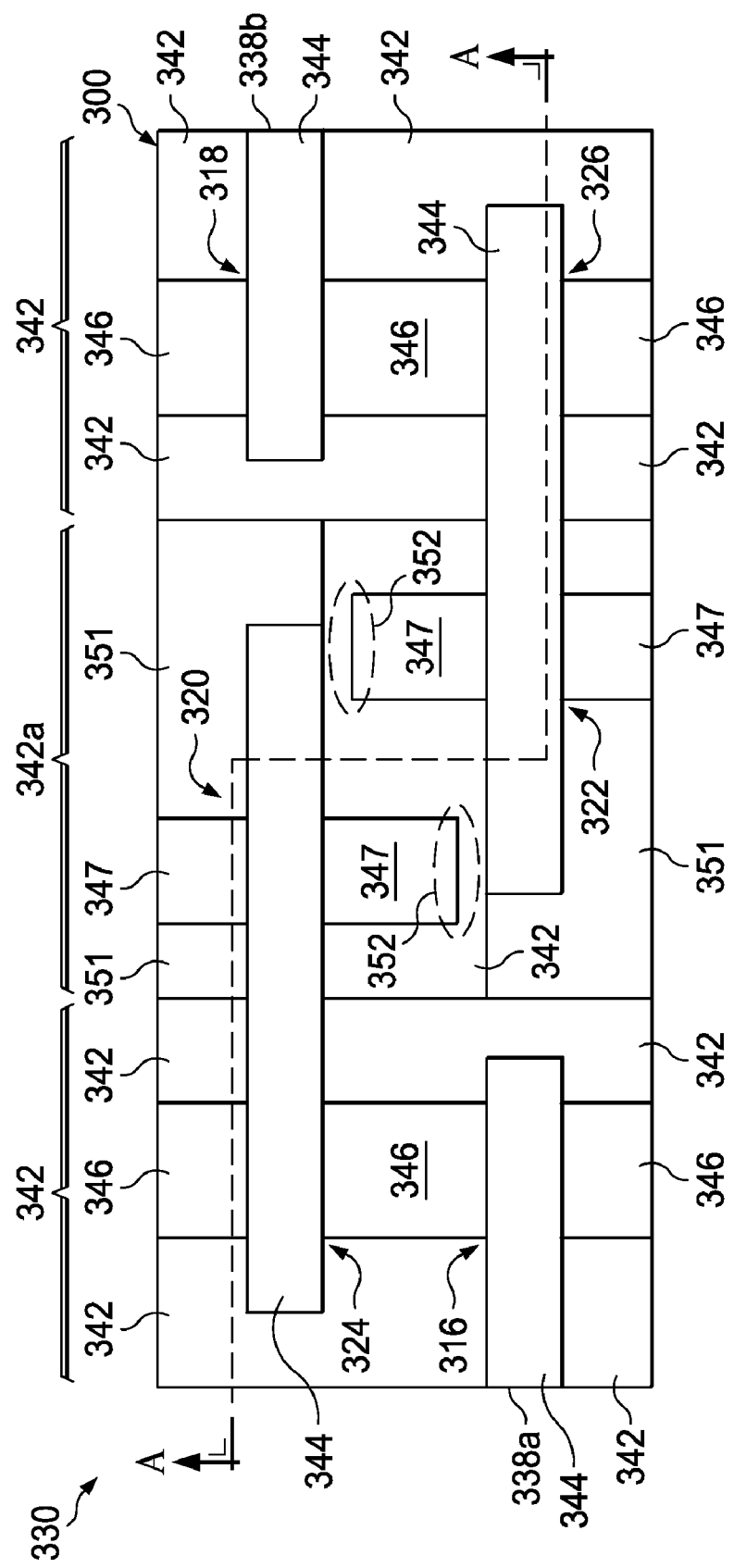

FIGS. 3A, 3B and 3C illustrate another 6T static random access memory (SRAM) cell 300 such as may be used in accordance with the present invention. SRAM cell 300 is similar to that of cell 200 of FIG. 2A, and as such need not be described again for the sake of brevity.

FIGS. 3B and 3C illustrate the physical layout of the SRAM cell 300 of FIG. 3A further illustrating an exemplary modified epitaxial etch mask pattern 342 and openings 342a, such as may be used in accordance with the present invention to prevent etching and subsequent selective epitaxial growth from the source/drain regions that generally correspond to moat tip regions of the SRAM cell 300.

FIG. 3A illustrates an exemplary SRAM cell 300 which generally comprises a pair of cross-coupled inverters 302, 304, generally connected between Vdd 312 and Vss 314 to store a data bit state. SRAM cell 300 further comprises a pair of pass transistors including pass gate A 316 and pass gate B 318 to read and write a data bit between the cross-coupled inverters, inverter A 302 and inverter B 304, and bitline BL 330 and bitline-bar BLB 332, respectively. Respective inverters 302, 304 comprise p-type MOS (PMOS) pull-up or load transistors; load transistor A 320 and load transistor B 322, and an n-type (NMOS) pull-down or driver transistor A 324 and driver transistor 326. Pass gate transistors 316, 318 are generally n-type as well, generally having shared gate leads connected together, and controlled by the same wordline WL 338.

FIGS. 3B and 3C, for example, illustrate a layout of an SRAM memory cell 300 during an epitaxial (epi) etch mask 342 patterning step of a fabrication process. As before, SRAM cell 300 is arranged having horizontal rows of polysilicon gate structures 344 and vertical columns of NMOS active regions 346 and PMOS active regions 347, and having isolation structures, for example, shallow trench isolation regions (STI) 351 therebetween to separate NMOS transistors formed in the active regions 346 from the PMOS transistors formed in the active regions 347. In the illustrated fabrication step, the epitaxial etch mask 342 is patterned overlying the NMOS active regions 346, thereby forming unmasked openings 342a in the mask 342 having a thickness 342b that exposes the PMOS active regions 347 to a subsequent etch process and to a selective epitaxial growth in these unmasked openings 342a.

However, in the modified selective epitaxial etch mask patterning 342/342a of the 6T SRAM cell 300 of the present invention, additional mask material 342 is used between the gate structures 344 and overlying the PMOS active regions 347 that generally correspond to moat tip regions 352. For example, these moat tip regions 352 are physically located at the ends of the PMOS active region 347 formed within an n-well 357 and where the source/drain regions of load transistors 320 and 322 are situated adjacent to an isolation structure STI 351. By masking this moat tip region 352, no etching or selective epitaxial growth will take place in these regions, and the defects associated therewith are avoided.

Thus, this solution creates improved asymmetric PMOS load transistors 320, 322, wherein this masked region 342 generally corresponds to the moat tip regions 352 of the SRAM cell 300. That is, although the PMOS load transistors 320, 322 have a source/drain region on opposing sides of a gate structure and channel region, only one of these source/drain regions receives the selective epitaxial growth, thereby asymmetrically forming PMOS load transistors. Beneficially, this solution of the present invention provides a method to significantly reduce the off-current (leakage) of the PMOS transistors (e.g., 320, 322) of the SRAM cell 300, for example, in the core region 110 of an SRAM device 100 having core 110 and logic regions 120. Further, by maintaining the selective epitaxial growth on one side of the PMOS transistor, the drive current is still improved greatly compared to a PMOS transistor not utilizing selective epitaxial growth.

The logic transistors of the logic region 120 of the SRAM device 100 may receive the conventional selective epitaxial etch and growth in both source and drain regions of the logic transistors, or may receive the asymmetrical masking in one of the source and drain regions. Alternatively, the entire SRAM core region 110 may be excluded from the epitaxial loop.

Figure 4A:
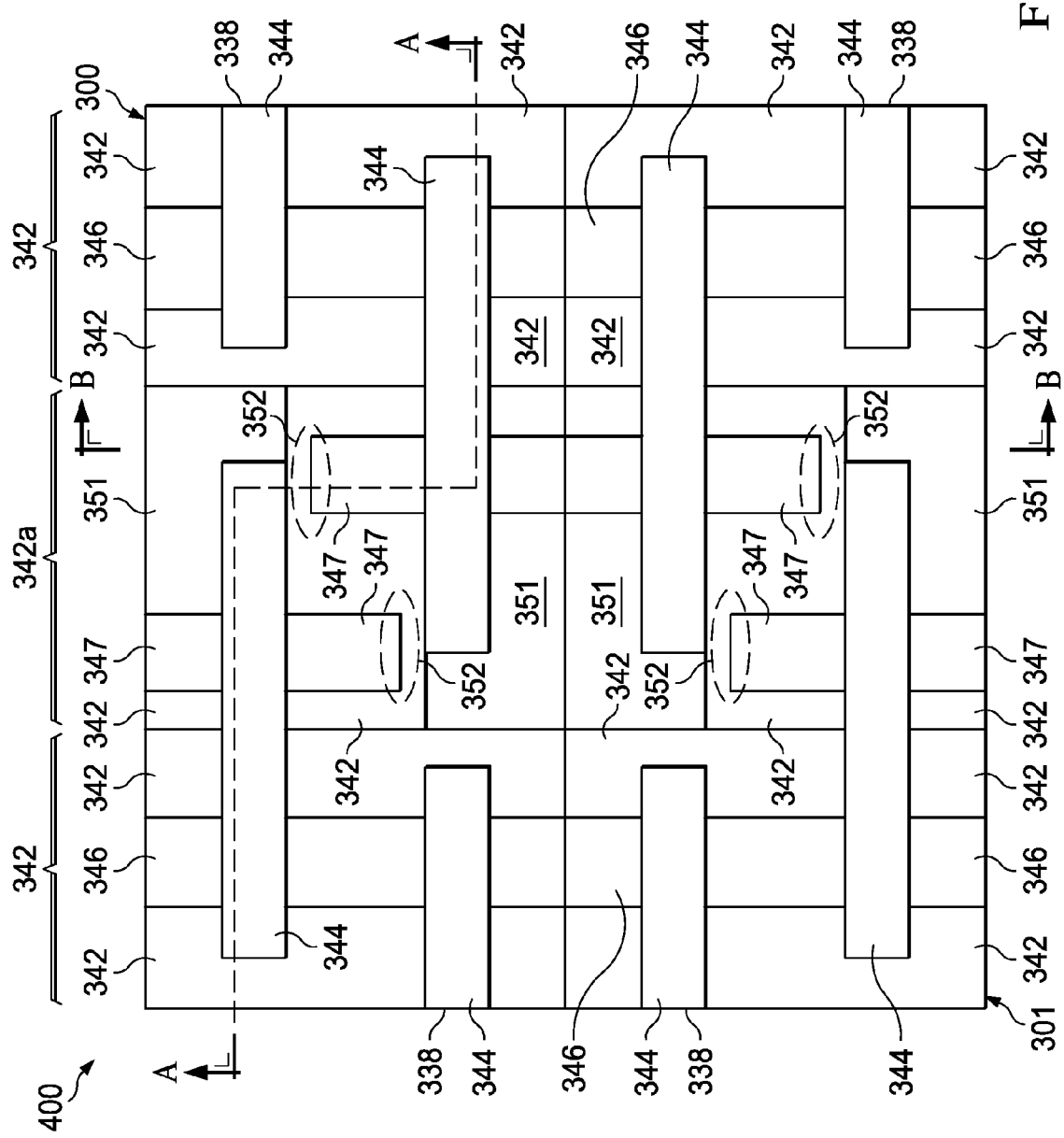
FIGS. 4A-4C are additional top plan and corresponding cross-sectional side views of two exemplary SRAM cells of an array of cells, similar to the SRAM cell of FIGS. 3A-3C, illustrating the exemplary modified epitaxial etch mask pattern used in accordance with the present invention that prevents etching and subsequent selective epitaxial growth from the source/drain regions generally corresponding to moat tip regions.
Figure 4B:
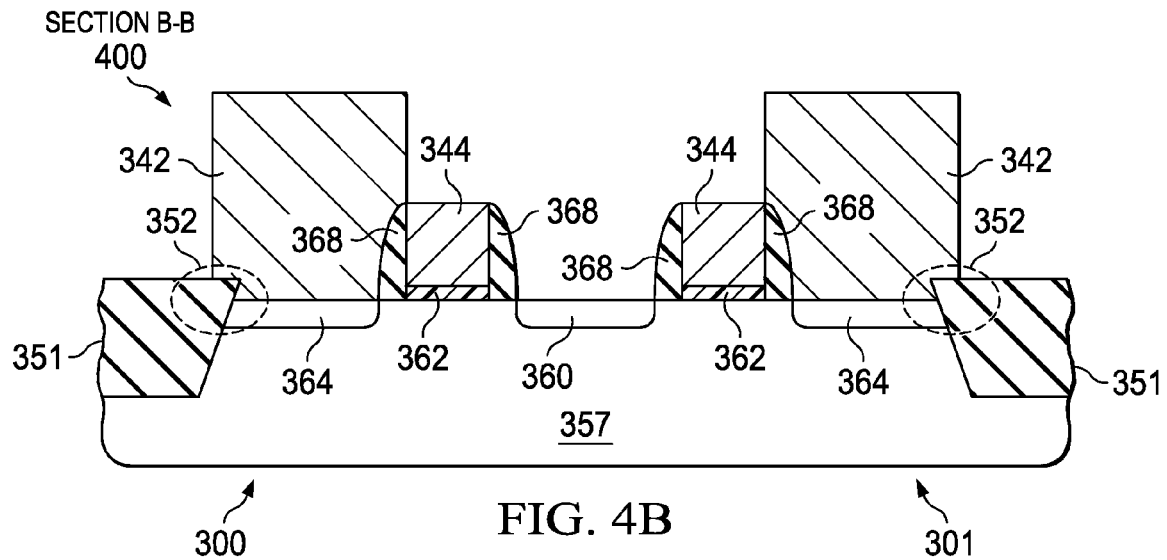
Figure 4C:
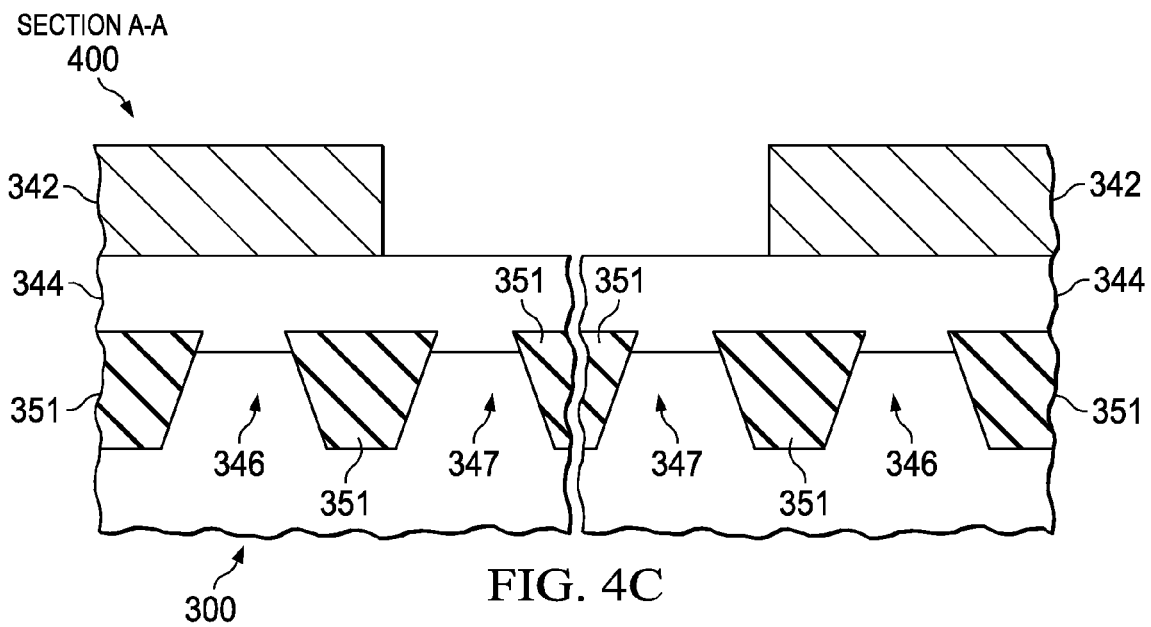

FIGS. 4A, 4B and 4C illustrate an SRAM array 400 of two SRAM memory cells 300 and 301, during a fabrication process wherein an epitaxial etch mask 342 is patterned similar to that which was described for the SRAM cell 300 of FIGS. 3A-3C, in accordance with the present invention. Again, the exemplary modified epitaxial etch mask pattern used in accordance with the present invention prevents etching and subsequent selective epitaxial growth in one of the source/drain regions 364 generally corresponding to moat tip regions 352. FIG. 4C is a composite broken cross-sectional view taken along the line A-A in FIG. 4A. FIG. 4B is a cross-sectional view taken along the line B-B of FIG. 4A.

FIG. 4B, for example, further illustrates the placement of the epitaxial etch mask 342 overlying the moat tip regions 352. The mask 342 thus protects the source/drain region 364 in PMOS active regions 347 formed within the n-well 357 at the moat tip regions 352, thereby avoiding the defects previously discussed. FIG. 4B further illustrates details of a gate structure of load transistor load B 322, comprising a gate oxide layer 362 formed overlying the p-doped silicon of the n-well 357, the gate poly 344 overlying the gate oxide 362, and side wall spacers 368 formed on lateral sidewalls of the gate for self-aligning subsequent source/drain implant processes in the source/drain regions 360 and 364.

Figure 5A:
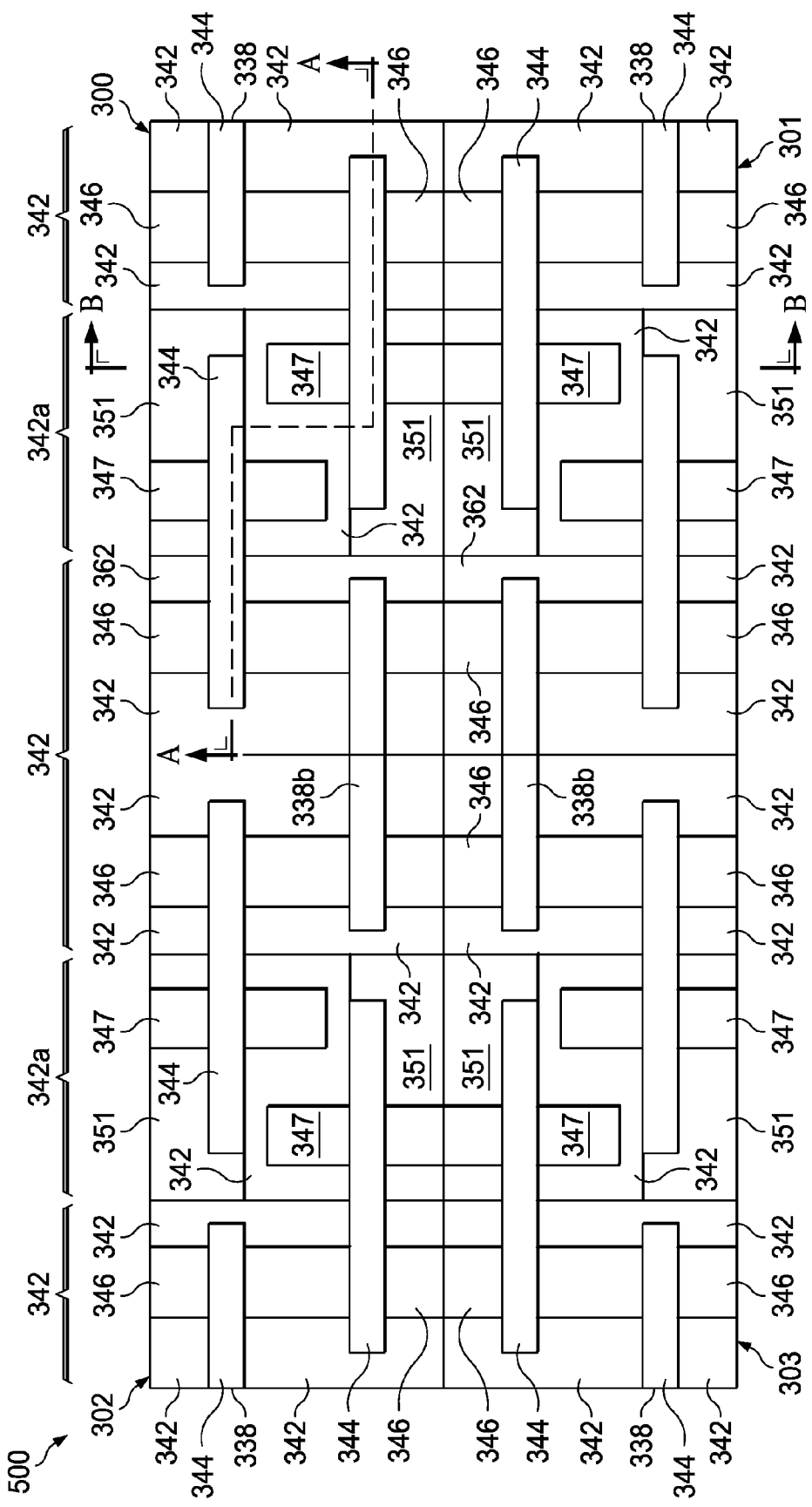
FIGS. 5A-5C are more top plan and corresponding cross-sectional side views of four exemplary SRAM cells of an array of cells, similar to the SRAM cell of FIGS. 3A-3C, illustrating the exemplary modified epitaxial etch mask pattern used in accordance with the present invention that prevents etching and subsequent selective epitaxial growth from the source/drain regions generally corresponding to moat tip regions.
Figure 5B:
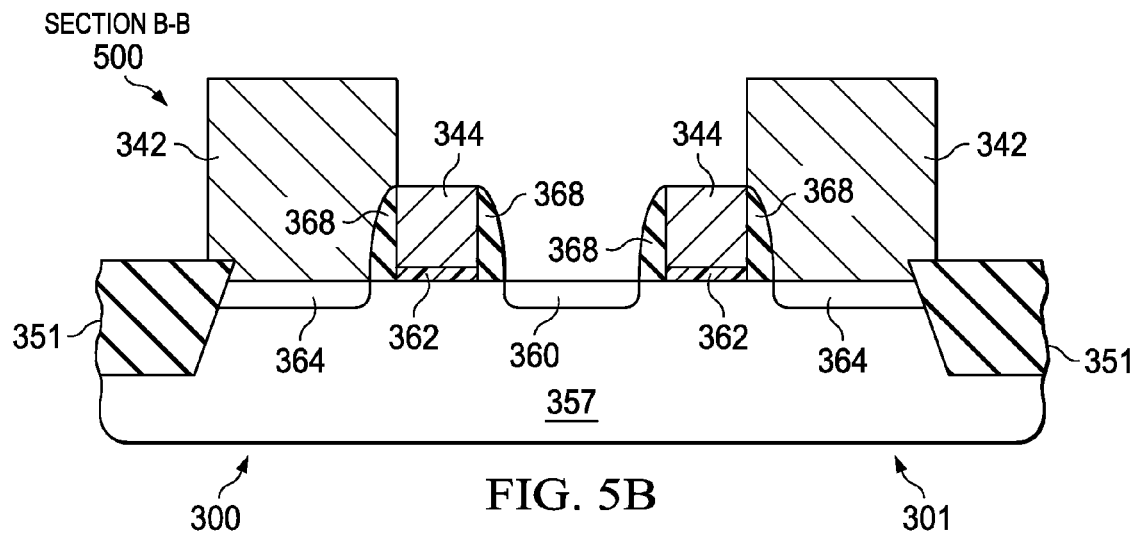
Figure 5C:
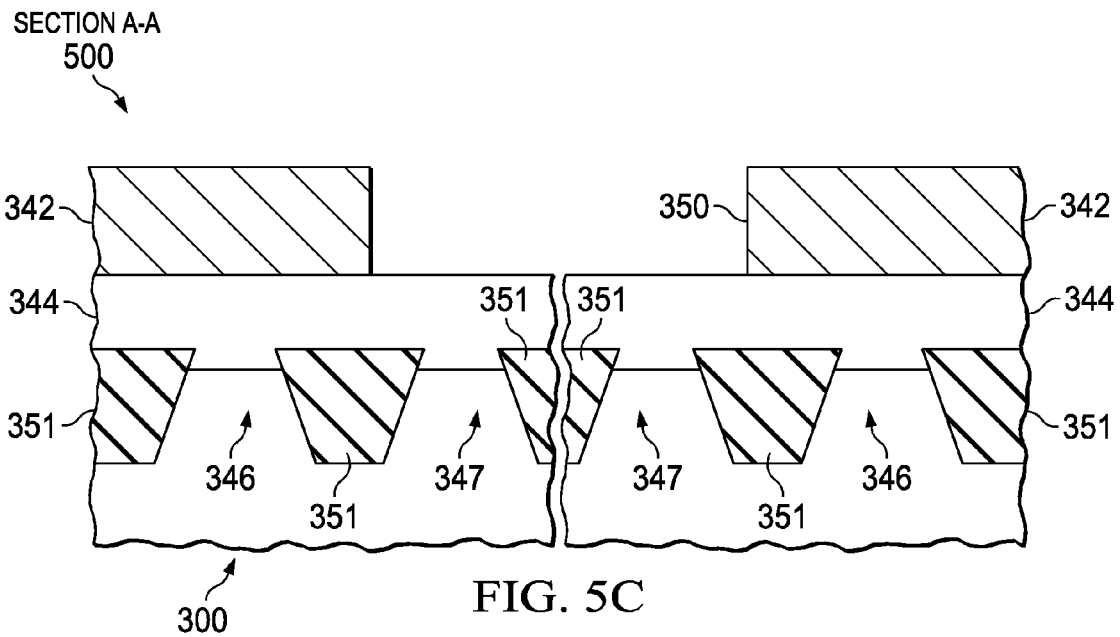

FIGS. 5A, 5B and 5C illustrate an SRAM array 500 of four SRAM memory cells 300, 301, 302, and 303, during a fabrication process wherein an epitaxial etch mask 342 is patterned similar to that which was described for the SRAM cell 300 and 301 of FIGS. 4A-4C, in accordance with the present invention. FIG. 5A further illustrates that the exemplary modified epitaxial etch mask pattern used over cells 302 and 303 of array 500 forms a mirror image of the mask over cells 300 and 301, wherein the etch mask 342 prevents etching and subsequent selective epitaxial growth from the source/drain regions 364 generally corresponding to moat tip regions 352 of the array 500.

Figure 6:
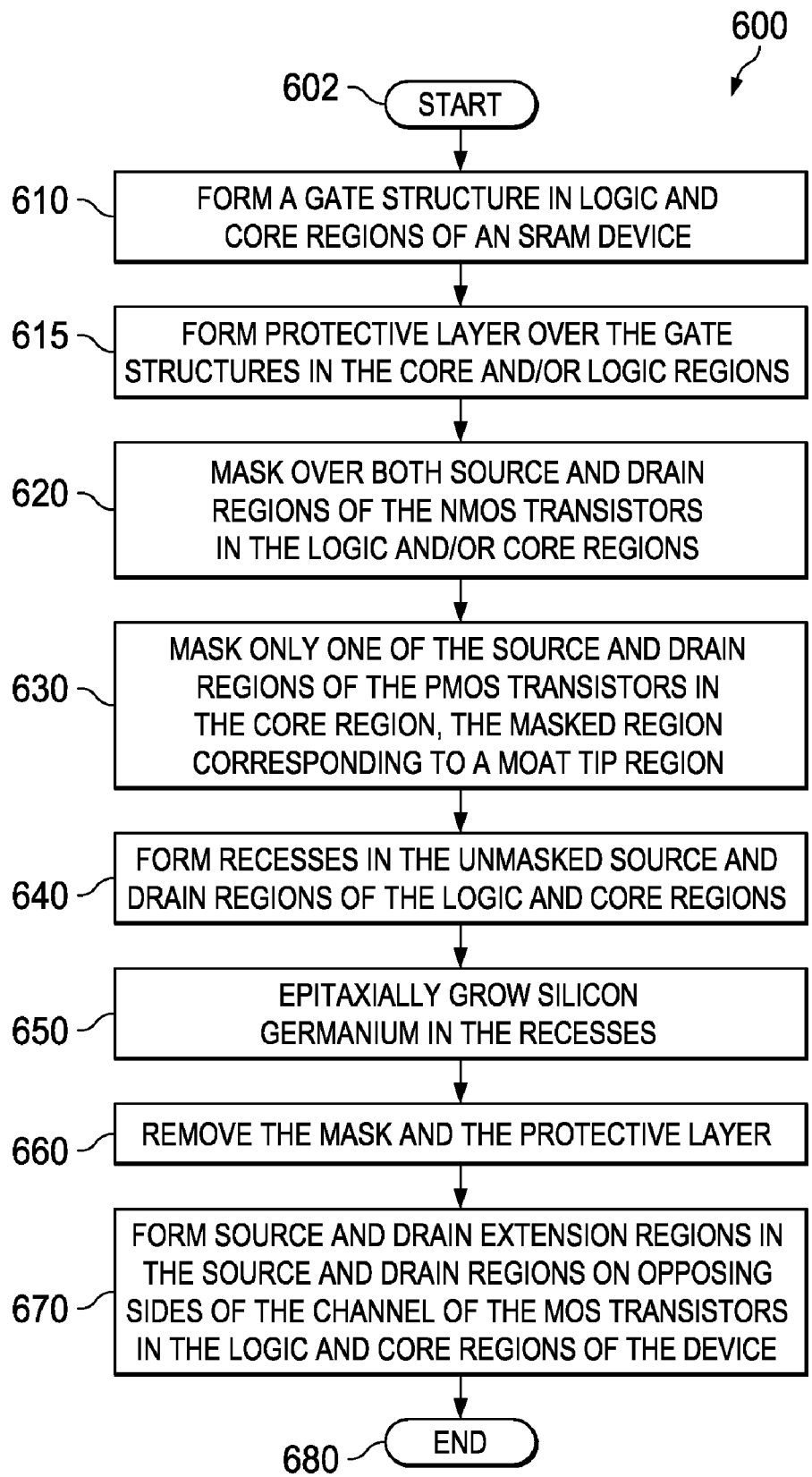
FIG. 6 is a flow diagram illustrating an exemplary method of forming an asymmetric SRAM memory device having improved mobility while reducing defects associated with selective epitaxial growth in moat tip regions of the core region of the memory device according to one aspect of the present invention.

FIGS. 7A-7I are fragmentary cross section diagrams illustrating various steps of forming PMOS transistors, such as may be used in the core region of an SRAM device in accordance with the method of FIG. 6.

Referring now to FIGS. 6 and 7A-7I, further aspects of the invention relate to methods of fabricating MOS transistors of an SRAM memory device, wherein FIG. 6 illustrates an exemplary method 600 in accordance with the invention, and FIGS. 7A-7I illustrate the exemplary MOS transistors of the SRAM memory device at various stages of fabrication in accordance with the invention. While the exemplary method 600 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of SRAMs, ICs and composite transistors illustrated and described herein, as well as in association with other transistors and structures not illustrated, including but not limited to NMOS and/or PMOS composite transistors formed in the core region and the logic region of an SRAM array.

The method 600 begins at 602, wherein transistor fabrication is initiated by the formation of gate structures in logic and core regions of an SRAM device, wherein transistor well formation and isolation processing may be initially performed. Act 610 may thus comprise defining NMOS and PMOS regions, wherein NMOS regions comprise a P-well in which n-type source/drain regions will later be formed, and PMOS regions comprise an N-well in which p-type source/drain regions will later be formed, respectively. In addition, isolation regions may comprise shallow trench isolation (STI) or field oxide regions (FOX) that serve to define various active areas and electrically isolate various active areas laterally from one another.

Act 610 may further comprise forming a gate oxide layer in active areas defined by the various formed isolation regions. In one example, the gate oxide comprises a thin, thermally grown silicon dioxide layer, however, other type gate dielectrics (such as high-k dielectrics) may be formed and are contemplated by the present invention. A conductive gate layer is then deposited over the gate oxide and is patterned to form a conductive gate electrode. For example, a polysilicon layer may be deposited via chemical vapor deposition (CVD) and patterned via etching to form gate electrodes in both NMOS and PMOS regions, respectively.

An offset spacer is then formed on lateral edges of the conductive gate electrodes also at 610. For example, a thin offset layer (e.g., an oxide or nitride layer) is formed generally conformally over the patterned gate and then etched using a generally anisotropic dry etch to remove offset layer material on top of the gate and in the source/drain regions, leaving a thin offset spacer material on lateral edges of the gate. The offset spacer, as will be further appreciated below, is employed in this example to space away the strain inducing material slightly away from the channel region under the gate, for example, a distance of about 5 nm to about 50 nm.

Optionally at 615, the method may further comprise forming a protective layer 720 overlying a portion of the gate structure (e.g., 714 of FIGS. 7D, 7E and 7F), for example, in the core 110 and/or logic 120 regions, before the formation of the recesses to prevent polysilicon gate loss and to prevent the formation of a recess in a top portion of the gate electrode (e.g., 344 of FIG. 4B, 714 of FIGS. 7C-7I) due to a subsequent recess etch process, for example.

A mask (e.g., 342 of FIGS. 3B-5C) is formed at 620 over both source and drain regions (e.g., 360 of FIGS. 3B-5C) on opposing sides of the channel of one or more MOS transistors (e.g., NMOS transistors) in the logic region (e.g., 120 of FIG. 1) and/or the core region (e.g., 110 of FIG. 1) of the SRAM device (e.g., 100 of FIG. 1). In one aspect of the invention, this step is optional.

The mask (e.g., 342 of FIGS. 3B-5C) is also formed at 630 in the moat tip regions (e.g., 352 of FIGS. 3B-5C) extending between the gate structure (e.g., 344 of FIGS. 3B-5C) and the neighboring isolation region (e.g., 351 of FIGS. 3B-5C), such that only one of the source and drain regions (e.g., 364 of FIGS. 3B-5C) of one or more MOS transistors (e.g., PMOS transistors) in the core region (e.g., 110 of FIG. 1) is masked. The moat tip region refers to the active region of the silicon body which is adjacent to an isolation region (e.g., 351 of FIGS. 3B-5C).

A recess is then formed in the unmasked source and drain regions of both the logic 120 and core regions 110 at 640. The recess is formed using, for example, a dry etching process such as the chemistry employed to etch STI trenches in the semiconductor body when forming isolation regions. The recesses, in one example extend into the semiconductor body to a depth of about 10-90 nm, and more preferably about 30-70 nm. In the present example, the gate structure is not masked during the recess formation; therefore if the gate electrode is composed of polysilicon, a method to protect the polysilicon lines during the recess etch may be employed to prevent polysilicon loss.

The method 600 then continues at 650, wherein silicon germanium (SiGe) is formed in the recesses. In one example, the silicon germanium is formed via a selective epitaxial deposition process such as an LPCVD (low pressure chemical vapor deposition) process using dichlorosilane and germane as the source gases. In one alternative of the present invention, the above reactants are employed to form SiGe in the recesses and subsequently the SiGe is subjected to a p-type implant to form a p-doped SiGe material (e.g., using Boron). Alternatively, and more preferably, the SiGe is doped in-situ during the selective epitaxial deposition process by incorporating a p-type dopant reactant in the CVD process. For example, diborane or other type reactant may be employed, wherein boron doped SiGe material is formed in the recesses (or other p-type dopant in the SiGe, as may be appreciated). The in-situ boron doping of the SiGe is preferred because it is believed that the in-situ doped boron is activated to a higher degree than when implanted into the SiGe, and therefore advantageously provides a lower subsequent extension region resistance.

While not intending to be limited to any one theory, it is believed that the silicon germanium within the recesses form an alloy that has a lattice with the same structure as the silicon body lattice, however, the silicon germanium has a larger body spacing. Consequently, it is believed that the silicon germanium within the recesses will tend to expand, thereby creating a compressive stress within the channel of the semiconductor body underneath the channel.

Thereafter, the selective epitaxial mask (e.g., 342 of FIGS. 3B-5C) and the polysilicon protective layer (e.g., 720 of FIGS. 7D, 7E and 7F) may be removed at 660.

Extension regions and source/drain regions may be subsequently formed in the active region of the silicon body at 670. For example, if the SiGe material is not doped in-situ as discussed above, an extension region implant is then performed, wherein dopants are introduced into the silicon germanium material in the recesses (both in the moat area as well as on a top portion of the gate electrode). For example, lightly doped, medium doped or heavily doped extension region implants are performed in the NMOS and PMOS regions, or alternatively, the NMOS regions and PMOS regions may be implanted separately with differing dopants by mask off each region, respectively. Since both the recesses (now filled with silicon germanium) and the extension region implants are formed after the offset spacer, both are self-aligned with respect to the offset spacer, thereby placing both regions extremely close to the lateral edge of the gate structure within the semiconductor body. A thermal process such as a rapid thermal anneal may then be employed to activate the extension region dopants, which causes the extension regions to diffuse laterally slightly underneath the offset spacer toward the channels.

Still referring to FIG. 6, source/drain sidewall spacers are then formed on the gate structures at 670. The sidewall spacers comprise an insulating material such as an oxide, a nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate structure at least about 50 nm. The source/drain regions are then formed by implantation at 670, wherein a source/drain dopant is introduced into the exposed areas (top of gate electrode and active areas not covered by sidewall spacers). The source/drain regions are then completed with a thermal process to activate the dopant.

The method 600 may then conclude with silicide processing, wherein a metal layer is formed over the device, followed by a thermal process, wherein the metal and silicon interfaces react to form a silicide (on top of the gate and in the source/drain regions). Unreacted metal is then stripped away, and back end processing such as interlayer dielectric and metallization layers are formed to conclude the device formation at 680.

The method 600 of the present invention advantageously forms the silicon germanium extremely close to the channel region of the SRAM device in only and one of the source/drain regions, for example, of the PMOS transistors in the core region of the array, but in both source and drain regions of the logic region of the SRAM device. Thus, in the method 600 of the present invention, an asymmetric PMOS transistor is formed having improved drive current and reduced leakage current compared to symmetrically formed selective epitaxial growth regions, while avoiding the defects associated selective epitaxial growth in the moat tip regions.

Alternately, in another aspect of the invention, the SiGe is only formed in the source and drain regions of the PMOS transistors of the logic region but is excluded entirely from the core region of the SRAM device. This variation may be accomplished as above and by masking over (e.g., covering over with resist) the entire core region of the array. Further, by residing close to the channel, the SiGe more efficiently transfers the desired stress to the channel. As can be seen, the asymmetric MOS transistor formation and recess location of the present invention provides for a substantial improvement in transistor performance.

Consequently, the formation of the recesses prior to the sidewall spacer formation advantageously provides for substantially improved transistor performance by increasing the electron mobility while mitigating undue formation of threading dislocation defects.

Figure 7A:
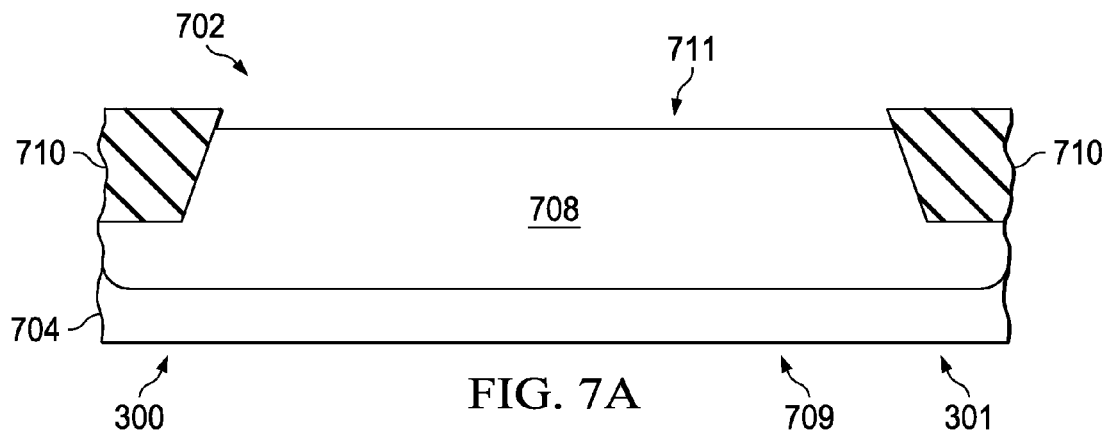
FIGS. 7A-7I are fragmentary cross section diagrams illustrating various steps of forming PMOS transistors, such as may be used in the core region of an SRAM device in accordance with the method of FIG. 6.
Figure 7B:
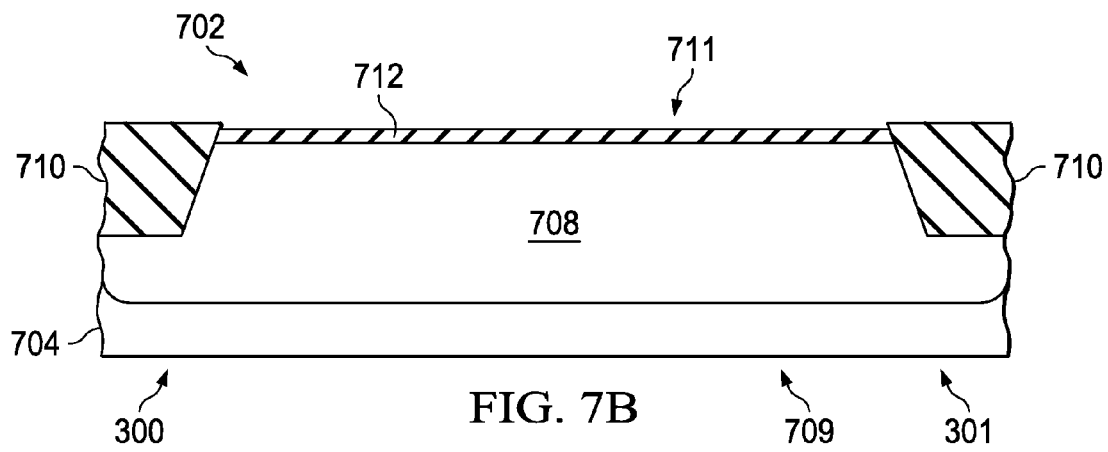

Turning now to FIGS. 7A-7I, a plurality of fragmentary cross section diagrams illustrating PMOS transistors of two neighboring cells of an SRAM memory array device being formed in accordance with the method 600 of the present invention of FIG. 6 is provided. In FIG. 7A, PMOS transistors of SRAM cells (e.g., cells 300 and 301 of FIGS. 3B-5C) of an SRAM memory array device 702 are provided, wherein a semiconductor body 704, such as a substrate, has one or more wells formed therein, such as a P-well (not shown) to define an NMOS transistor device region, or an N-well 708 to define a PMOS transistor device region 709, respectively. Further, isolation regions 710 such as STI regions 710 are formed in the semiconductor body 704 to define active area regions 711, as may be appreciated. In FIG. 7B, the SRAM device 702 is illustrated, wherein a gate dielectric 712 has been formed, for example, thermally grown $SiO_2$, over the active areas 711.

Figure 7C:
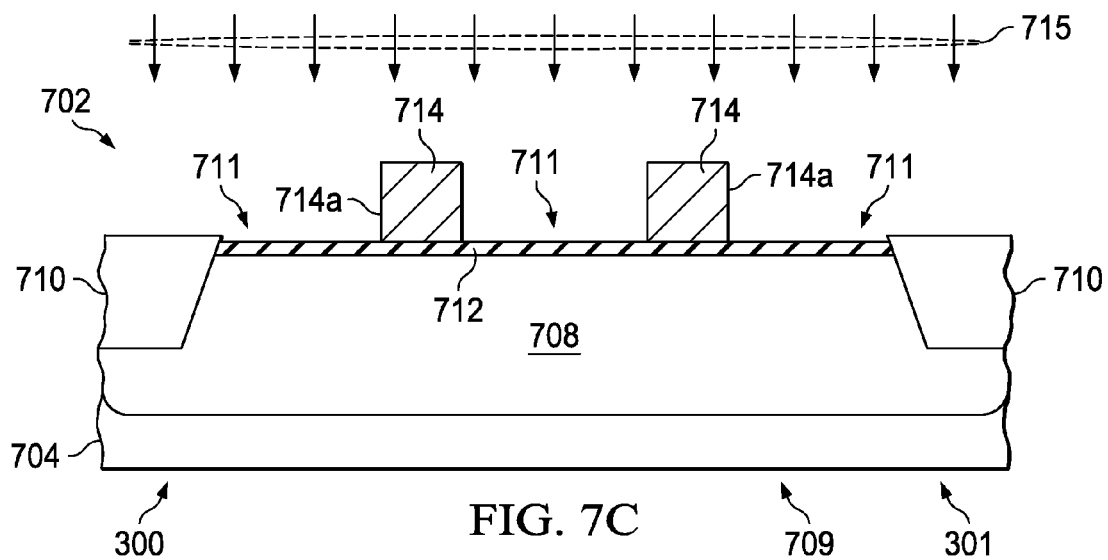
Figure 7D:
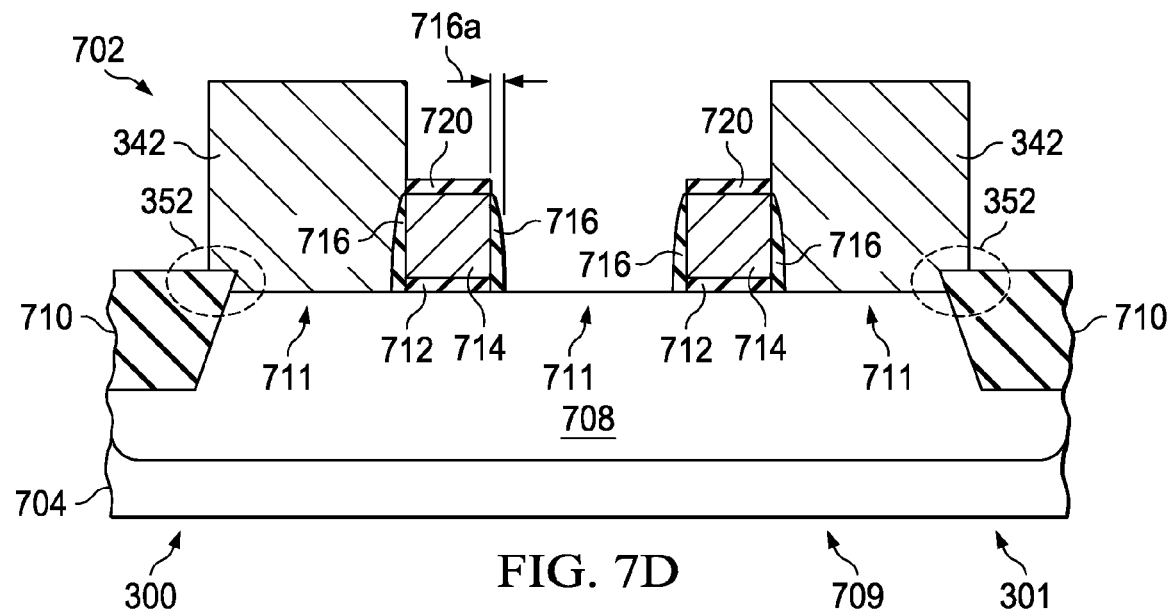

Referring to FIGS. 7C and 7D, a conductive gate electrode material (e.g., polysilicon 344) has been deposited and patterned via an etching process 715 to form two gate electrodes 714 of two neighboring cells 300, 301 overlying the gate oxide 712. An offset spacer 716 is then formed on the lateral edges 714a of the gate electrode (714 of FIG. 7D), wherein the offset spacers 716 have a width 716a of about 10-50 nm.

In FIG. 7D, where the gate electrode comprises polysilicon, a polysilicon protective layer 720 is formed overlying the gate structures 714 in the logic and core regions (e.g., respectively 120 and 110 of FIG. 1) to prevent the formation of a recess in the top portion of these polysilicon lines. In addition, an epitaxial etch mask 342 is also formed overlying the moat tip regions 352 of the active regions 711, extending between the gate structure 714 and the isolation regions STI 710. Mask 342 protects the moat tip regions 352 from the subsequent selective epitaxial etch and growth processes, thereby avoiding the defects otherwise resulting therefrom.

Figure 7E:
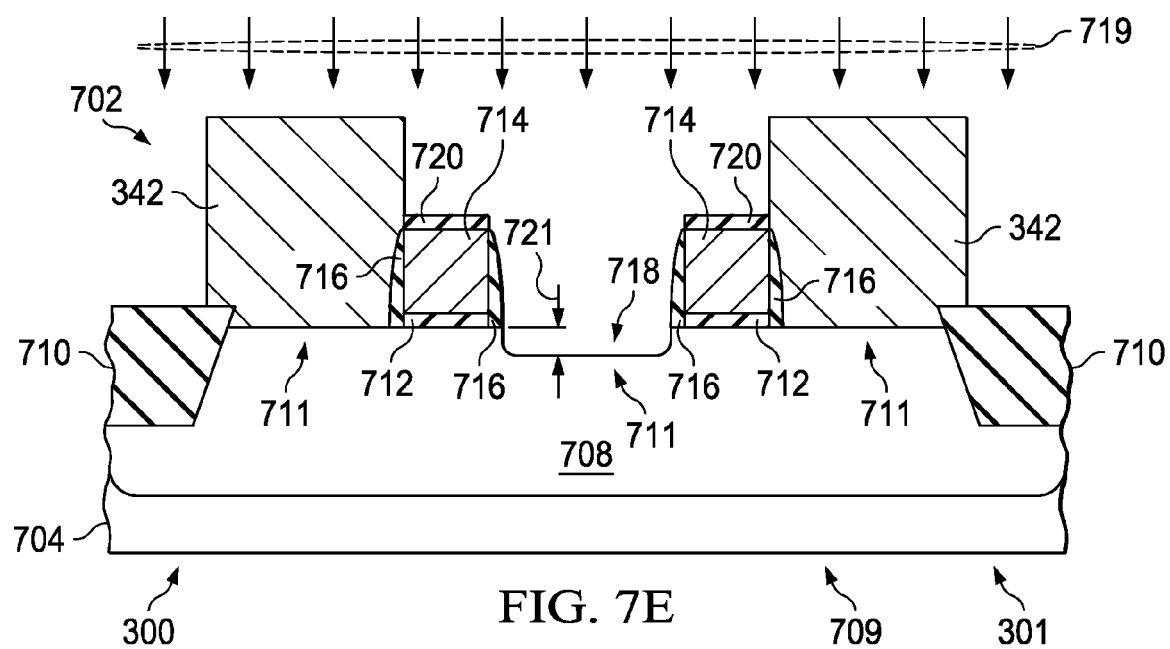

In FIG. 7E, a recess 718 is then formed in the active areas using an etch process 719, wherein the epitaxial etch mask 342, the gate electrode 714, and isolations areas 710 serve as a mask for the silicon of the N-well 708 in active areas 711. The recess 718 is then formed into the semiconductor body to a depth 721 of about 10-90 nm, and more preferably about 30-70 nm, for example. Although the example illustrated herein has the recess 718 formed after an offset spacer 716, such recess may be formed prior to such a spacer, wherein in such instance the recess 718 is aligned to the lateral edges 714a of the gate structures. In such instances, care should be taken to prevent a shorting of the gate to the subsequently formed epitaxial material by providing some type of isolation therebetween.

Figure 7F:
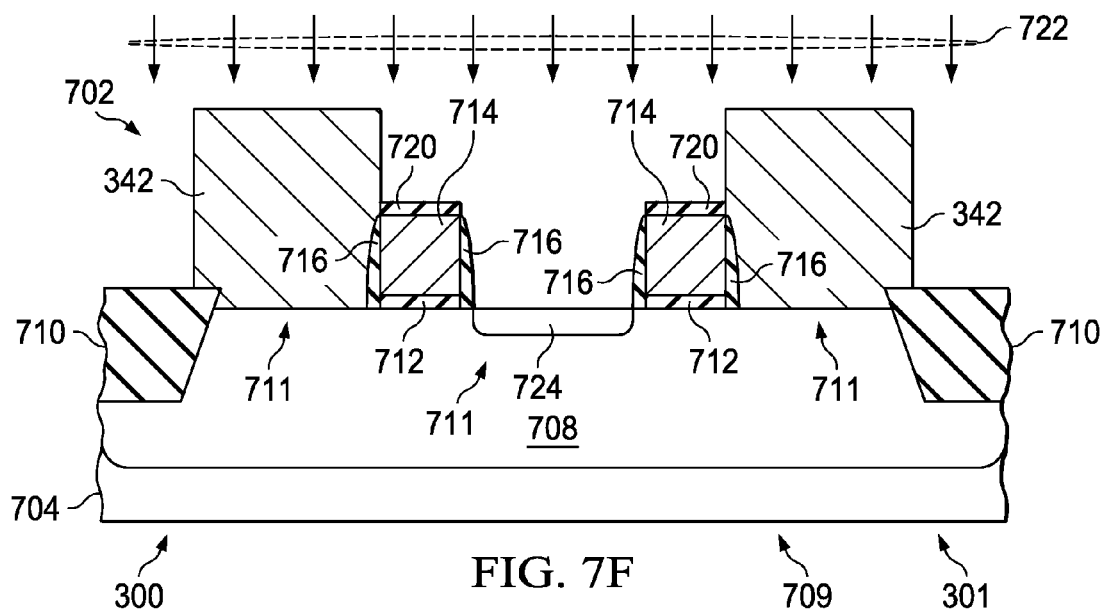

Turning now to FIG. 7F, a selective epitaxial deposition process 722 is provided, wherein a silicon germanium material SiGe 724 is formed in the recess 718. Thereafter, the epitaxial etch mask 342 and the polysilicon protective layer 720 may be removed and optionally, the source/drain extension regions may be formed in source/drain regions on opposing sides of the channel of the MOS transistors in the logic 120 and core regions 110 of the SRAM device 702.

As highlighted above, the process 722 may comprise an epitaxial deposition process, wherein a germanium containing source gas such as germane is added to the silane or dichlorosilane, such that a silicon germanium material is formed in the recesses. Further, in one example, the selective epitaxial process further includes a diborane source gas to provide for the SiGe to be doped with boron in-situ. Alternatively, other p-type source gases may be employed, as may be appreciated.

Alternatively, the SiGe material may be formed in the recess 718, and the SiGe 724 subsequently doped with a p-type dopant to form a p-type extension region in the PMOS region. In such case, the PMOS region 709 is then masked with a masking material such as photoresist, and an extension region implant is performed to form n-type extension regions in the NMOS region. A thermal process such as a rapid thermal anneal is then performed to activate the dopant, wherein a lateral diffusion of the extension regions under the offset spacer 716 is achieved.

Figure 7G:
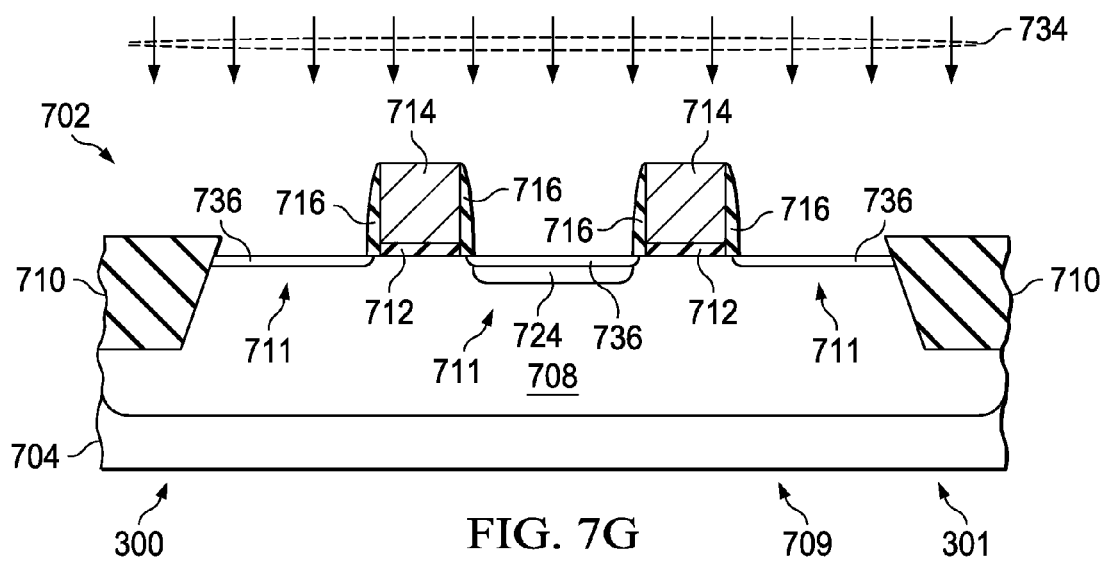

The p-type extension region mask is then removed, and an n-type extension region mask is deposited and patterned to cover the NMOS region (not shown). In FIG. 7G, a p-type extension region implant process 734 is then performed to form p-type extension regions 736 in the PMOS region 709 of SRAM cells 300 and 301, as illustrated.

Figure 7H:
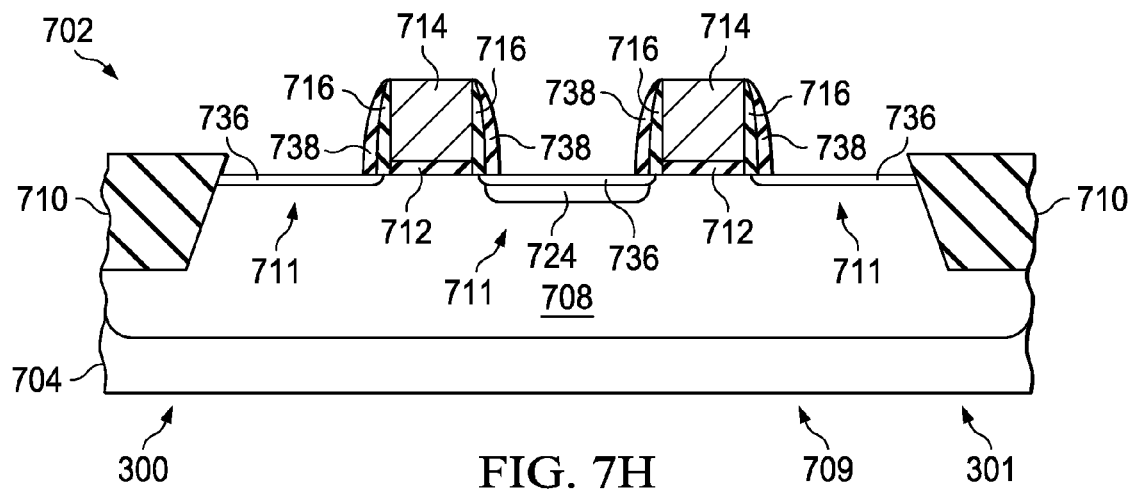

The n-type extension region mask (not shown) is then removed and source/drain sidewall spacers are formed over the offset spacers 716 on the lateral edges of the gate structures. An insulating sidewall material is deposited in a generally conformal manner over the device 702 and subsequently subjected to an anisotropic etch to remove the insulating material on top of the gate 714 and over the active areas 711, leaving sidewall spacers 738 in both the NMOS region and the PMOS region 709, as illustrated in FIG. 7H.

Figure 7I:
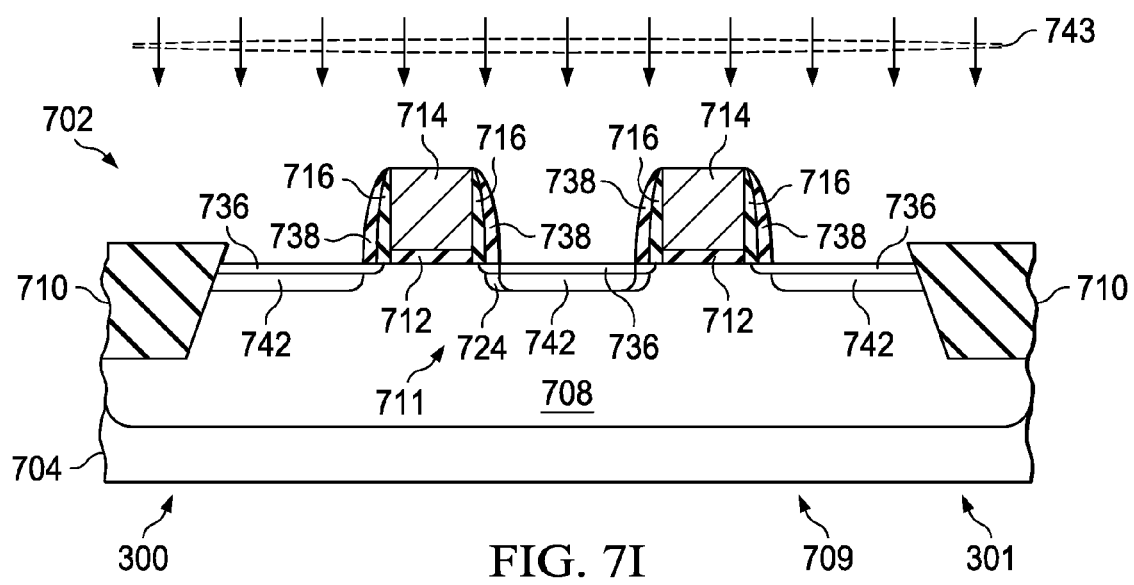

In FIG. 7I, the method concludes with the formation of source and drain regions 742 in the PMOS regions 709 as well as the NMOS regions (not shown). As discussed above in conjunction with the extension region implants, the source/drain implants 743 are performed with an NSD mask (not shown) and then a PSD mask (not shown) in order to implant the NMOS region and the PMOS region 709 separately with n-type and p-type dopant, respectively. As can be seen in FIG. 7I, the source/drain regions 742 are self-aligned with respect to the sidewall spacers 738, and thus are laterally spaced from the extension regions 736 and the SiGe strain regions 724 nearest the channel (underlying the gate 714).

Thereafter, a silicidation process may be performed, wherein a metal layer is deposited, for example, via sputtering, over the device, followed by a thermal process. During the thermal processing, those regions where the metal contacts silicon reacts to form a metal silicide (not shown). More particularly, the silicide forms on the source/drain regions 742 and on top of the gates 714. Subsequently, back end processing including metallization may be performed to interconnect the various transistors, as may be desired.

Thus, the resulting transistors (e.g., PMOS load transistors 320, or 322) of the core region 110 are fabricated asymmetrically in accordance with the method of the invention of FIG. 6, while the transistors of the logic region 120 are conventionally fabricated symmetrically. Note that the silicon germanium stress inducing region 724 is asymmetrically formed, wherein SiGe 724 is formed on only one side of each of the PMOS transistors of the PMOS region 709 of the core region 110, and that this SiGe region 724 is substantially closer to the channel than the source/drain regions 742. As a result, the overall stress induced underlying the channel of the PMOS cell transistors of the core region 110 is lower, for example, than the PMOS logic transistors of the logic region 120 of FIG. 1, having selective epitaxial SiGe growth on both sides of the channel. Further, having the silicon germanium region 724 substantially closer to the channel provides for a substantial improvement over the prior art in that substantially less germanium is needed to impart the desired compressive stress to the channel. Consequently, with less germanium needed, few threading dislocation defects are generated, thereby resulting in substantial performance improvements over the prior art, for example, reduced leakage.

The asymmetric transistor configuration eliminates the subsurface leakage path located deep into the substrate, under the channel, away from the gate control. This is accomplished in the asymmetric transistor configuration by having only one of the source and drain regions subjected to recess and stressor filling, which removes the short path between two adjacent stressor regions that exist under the gate of symmetric transistors.

The asymmetric transistor configuration when used to fabricate reduced drive current PMOS load transistors 220 and 222 at the SRAM core 110, can reduce the risk of write failures and improve a disturb failure margin on the cell. The weakening of the SRAM PMOS load transistors relative to the logic PMOS transistor increases the ratio of the drive current of the NMOS drive transistor 224 and 226 over the drive current of the PMOS load transistor 220 and 222. This ratio of transistor drive currents on the SRAM cell is typically referred as beta ratio. A higher beta ratio, which is achieved with a PMOS load transistor with reduced drive current, improves the yield of the SRAM core 110 by reducing write and disturb failures. The asymmetric transistor configuration can achieve such improvements without sacrificing the drive current performance of the PMOS transistors on the logic region 120.

Therefore, the method of the invention protects the moat tip regions during the entire selective epitaxial process to avoid the growth thinning and silicide pipe formation defects, and reduces the subsurface leakage associated with these regions. Accordingly, the systems and methods of the present invention provide a memory device, for example, wherein the PMOS transistors of an SRAM memory device having core and logic regions, exhibit improved mobility and drive current due to the application of stress to the channel, and reduced defects associated with selective epitaxial growth in moat tip regions of the core region of the device.

In the above manner, the device may be fabricated with optimized PMOS transistors without any strain applied to the channel in NMOS devices if desired.

Further, while the invention is generally described above with respect to PMOS transistor fabrication within the core region (e.g., 110 of FIG. 1) of an array (e.g., 100 of FIG. 1), NMOS and PMOS transistors may be fabricated concurrently in the logic region (e.g., 120 of FIG. 1) of the array.

In addition, while the invention is described above with respect to the use of germanium to form a silicon germanium lattice structure, the present invention contemplates the use of any element that will create an alloy with silicon and serve to impart a compressive stress to the channel of the PMOS devices, and such alternatives are contemplated as falling within the scope of the present invention.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein. Additionally, the layers can be formed in any number of suitable ways, such as with spin-on techniques, sputtering techniques (e.g., magnetron or ion beam sputtering), (thermal) growth techniques and/or deposition techniques such as chemical vapor deposition (CVD), for example.

What is claimed is:

1. An SRAM memory device, comprising:
a semiconductor body including a logic region and a core region;
a doped well region formed in an active region defined by isolation structure in the core region of the semiconductor body;
respective gate electrodes of two transistors of adjacent memory cells formed over the active region, the gate electrodes having respective sides adjacent the isolation structure and sides away from the isolation structure;
an epitaxial growth region formed in the well region on the sides of the gate electrodes away from the isolation structure, the epitaxial growth region inducing strain in respective channel regions defined under the gate electrodes;
a first source/drain region formed in the epitaxial growth region and commonly shared by the two transistors;
respective second source/drain regions of the two transistors formed in the well region on the sides of the gate electrodes adjacent the isolation structure; the second source/drain regions being formed in parts of the well region having no epitaxial growth region at least in moat tip regions adjacent the isolation structure;
sidewall spacers formed on the respective gate electrodes; the epitaxial growth region extending below facing ones of the sidewall spacers of the two transistors,
wherein the first source/drain region is self-aligned with the facing sidewall spacers, leaving portions of the epitaxial growth region laterally spaced from the first source/drain region, source/drain extension regions formed in the portions of the epitaxial growth region laterally spaced from the first source/drain region,
a second doped well region formed in a second active region defined by second isolation structure in the logic region of the semiconductor body;
respective second gate electrodes of second two transistors formed over the second active region, the second gate electrodes having respective sides adjacent the second isolation structure and sides away from the second isolation structure;
a second epitaxial growth region formed in the second well region on the sides of the second gate electrodes away from the second isolation structure, the second epitaxial growth region inducing strain in second channel regions defined under the second gate electrodes;
a third source/drain region formed in the second epitaxial growth region and commonly shared by the second two transistors;
respective third epitaxial growth regions formed in the second well region on the sides of the second gate electrodes adjacent the isolation structure; and
respective fourth source/drain regions of the second two transistors formed in the respective third epitaxial growth regions.

2. The device of claim 1, wherein the second source/drain regions are formed only in parts of the well region having no epitaxial growth region therein.

3. The device of claim 1, wherein the second source/drain regions are formed only in parts of the second well region having no epitaxial growth region therein.

4. The device of claim 3, further comprising first sidewall spacers formed on the respective gate electrodes; second sidewall spacers formed on the respective second gate electrodes; the epitaxial growth region extending below facing ones of the first sidewall spacers; and the second epitaxial growth region extending below facing ones of the second sidewall spacers.

5. The device of claim 4, wherein the first source/drain region is self-aligned with the facing first sidewall spacers, leaving portions of the epitaxial growth region laterally spaced from the first source/drain region; and the third source/drain region is self-aligned with the facing second sidewall spacers, leaving portions of the second epitaxial growth region laterally spaced from the third source/drain region.

6. The device of claim 5, further comprising first source/drain extension regions formed in the portions of the epitaxial growth region laterally spaced from the first source/drain region; and second source/drain regions formed in the portions of the second epitaxial growth region laterally spaced from the second source/drain region.

7. An SRAM memory device, comprising:
a silicon semiconductor body including a logic region and a core region;
an N-type doped well region formed in an active region defined by shallow trench isolation structure in the core region of the silicon semiconductor body;
respective gate electrodes of two PMOS transistors of adjacent memory cells formed over the active region, the gate electrodes having respective sides adjacent the shallow trench isolation structure and sides away from the shallow trench isolation structure;
an epitaxial growth region of silicon germanium material formed in the well region on the sides of the gate electrodes away from the shallow trench isolation structure;
a first P-type doped source/drain region formed in the epitaxial growth region of silicon germanium material and commonly shared by the two PMOS transistors;
respective second P-type source/drain regions of the two PMOS transistors formed in the well region on the sides of the gate electrodes adjacent the shallow trench isolation structure; the second source/drain regions being formed in parts of the well region having no epitaxial silicon germanium growth therein,
a second N-type doped well region formed in a second active region defined by second shallow trench isolation structure in the logic region of the silicon semiconductor body;
respective second gate electrodes of second two PMOS transistors formed over the second active region, the second gate electrodes having respective sides adjacent the second shallow trench isolation structure and sides away from the second shallow trench isolation structure;
a second epitaxial growth region of silicon germanium material formed in the second well region on the sides of the second gate electrodes away from the second shallow trench isolation structure;
a third P-type source/drain region formed in the second epitaxial growth region of silicon germanium material and commonly shared by the second two PMOS transistors;
respective third epitaxial growth regions of silicon germanium material formed in the second well region on the sides of the second gate electrodes adjacent the second shallow trench isolation structure; and
respective fourth source/drain regions of the second two PMOS transistors formed in the respective third epitaxial growth regions of silicon germanium material.

* * * * *